Dec. 14, 1954 J. P. STELMAK 2,697,189

ELECTRODE FOR SEMICONDUCTOR DEVICES

Filed Nov. 16, 1949

Inventor
JOHN P. STELMAK
H. C. Newton
Attorney

United States Patent Office 2,697,189

Patented Dec. 14, 1954

2,697,189

ELECTRODE FOR SEMICONDUCTOR DEVICES

John P. Stelmak, Forest Hills, N. Y., assignor to Radio Corporation of America, a corporation of Delaware Application November 16, 1949, Serial No. 127,615

5 Claims. (Cl. 317—235)

This invention relates to semi-conductor devices and particularly to multi-electrode semi-conductor amplifiers and oscillators.

A semi-conductor device or transistor which may be used as an amplifier or oscillator, generally includes a semi-conducting crystal provided with a low-resistance, large-area electrode usually called the base electrode and with two high-resistance, small-area electrodes which are commonly designated emitter and collector electrodes. The emitter and collector electrodes usually are point electrodes which are in rectifying contact with the semi-conducting crystal. These two point electrodes are closely spaced from each other and their distance is of the order of a few mils and many amount to less than one mil. The gain, the power output and the high frequency performance of such a semi-conductor amplifier are greatly improved by a closer spacing of the emitter and collector electrodes. However, such close spacing of the rectifying electrodes presents appreciable mechanical difficulties and furthermore short circuits may occur between the emitter and collector electrodes when they are spaced one mil or less.

It is an object of the present invention, therefore, to provide an improved multi-electrode semi-conductor amplifier or oscillator having an electrode structure which permits closer spacing of certain electrodes thereby to provide high gain while preventing short circuiting of said electrodes.

A further object of the invention is to provide improved rectifying electrodes, that is, emitter and collector electrodes, for a transistor which will facilitate the positioning of the electrodes on the semi-conducting crystal with a predetermined small distance between the electrodes which may be of the order of one mil, for purposes above stated.

A semi-conductor device in accordance with the present invention comprises a semi-conducting body and two electrodes in rectifying contact with the body. The two rectifying electrodes are spaced from each other and insulated by a relatively thin layer or film of insulating material which is disposed between the electrodes. Thus, the two electrodes may consist of wires having pointed ends, each wire being coated with an insulating layer. In this case, the spacing of the electrodes is determined by the thickness of the insulating coating. Alternatively, one of the electrodes may consist of a pointed wire while the second electrode may be a tube enclosing the first electrode and having a tapered end portion contacting the crystal. An insulating sleeve spaces the two electrodes and prevents short circuiting thereof.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
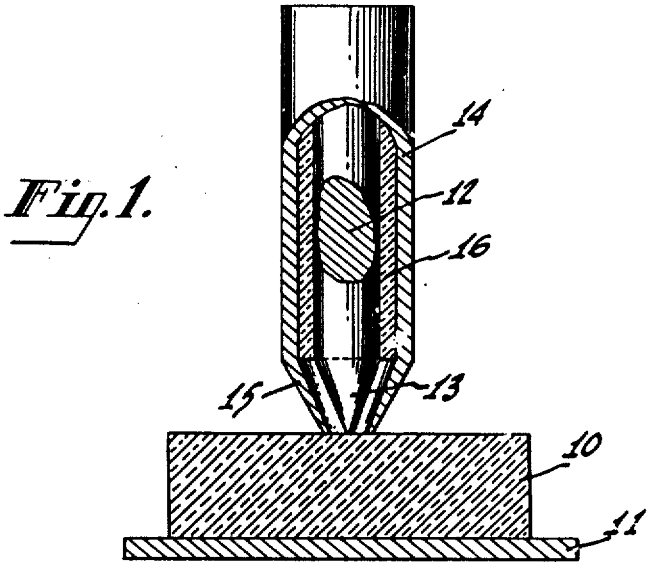
Figure 1 is a side elevational view, with parts broken away, of a three-electrode semi-conductor device embodying the invention.

Referring now to the drawing in which like components have been designated by the same reference numerals throughout the figures, and particularly to Figure 1, there is illustrated a semi-conductor device embodying the present invention which may be used as an amplifier, oscillator or the like. The device comprises a block or body 10 of semi-conducting material consisting, for example, essentially of a chemical element having semi-conducting properties such as germanium, silicon, boron, tellurium, or selenium containing a small but sufficient number of atomic impurity centers or lattice imperfections as commonly employed for best results in crystal rectifiers. Germanium is the perferred material for body 10 and may be prepared so as to be an electronic N-type semi-conducting crystal as is well known. The top surface of semi-conducting body 10 may be polished and etched as is conventional. It is also feasible to utilize the germanium block from a commercial high-back voltage germanium rectifier such as the type 1N34.

Electrode 11 makes a large-area, low-resistance contact with body 10 and may be used as the base electrode of a semi-conductor amplifier. Electrode 11 may consist of any suitable metal such as copper which may, for example, be soldered or sweated to body 10. Electrodes 12 and 14 are in rectifying contact with body 10. Electrode 12 is the collector electrode and has a point contact with body 10. Thus, collector electrode 12 may consist of a wire of tungsten or Phosphor bronze which may have a diameter of 5 mils or less. Collector electrode 12 preferably is provided with a conical tip 13 as shown to provide substantially a point contact with the surface of body 10. Electrode 14 is the emitter electrode preferably consisting of a metallic tube or sleeve surrounding collector electrode 12. Emitter electrode 14 may be made of the same metal of which electrode 12 consists. Emitter electrode 14 is provided with a tapered end portion 15 having a sharp edge in contact with body 10. Thus, emitter electrode 12 also has essentially a point contact or a small-area contact with body 10. The edge of emitter electrode 14 in contact with the surface of body 10 may be circular, semi-circular or a smaller portion of a circle.

In accordance with the present invention, collector electrode 12 is provided with insulating layer or film 16 of predetermined fixed thickness which spaces electrodes 12 and 14 as shown. Insulating layer 16 does not extend over conical end portion 13 of collector electrode 12 or over the tapered end portion 15 of emitter electrode 14. Insulating layer 16 may, for example, consist of a suitable film of enamel or of formex or collector electrode 12 which is conventionally employed to insulate fine wire such as used for the windings of electromagnets. Alternatively, wire 12 may be sprayed with unpolarized Lucite to provide an insulating film of the desired thickness. Instead of applying insulating layer 16 by spraying it on wire 12 an insulating sleeve may be provided of a suitable insulating material. This may, for example, be achieved by coating wire 12 with a suitable grease and spraying enamel or Lucite over the grease. The advantage of such an arrangement is that insulating sleeve 16 may be moved with respect to wire 12.

Insulating layer 16 thus serves the purpose of spacing electrodes 12 and 14 from each other and locating them on the surface of body 10. It is still possible, however, to move one electrode with respect to the other longitudinally. The gap between conical point 13 and tapered end portion 15 may be approximately 2 mils.

Figure 2:
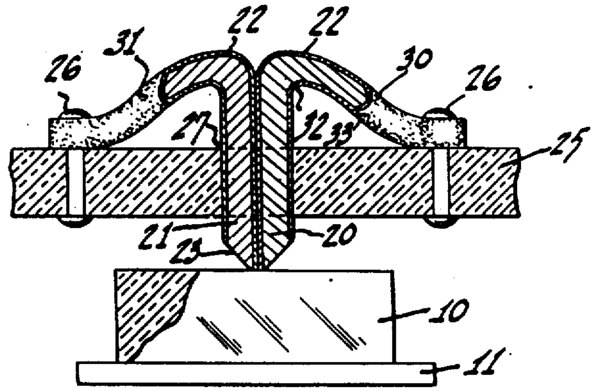
Figure 2 is a side elevational view, with parts broken away, of a modified transistor in accordance with the invention.
Figure 3:
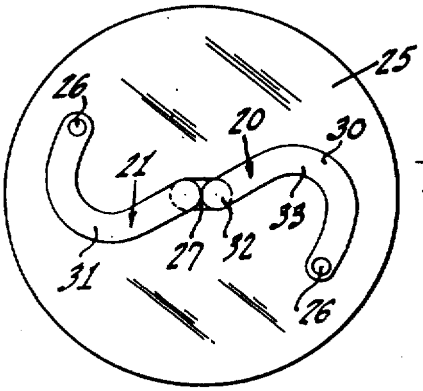
Figure 3 is a top plan view of the transistor Figure 2.

A modified semi-conductor device in accordance with the invention is illustrated in Figures 2 and 3. Semi-conducting body 10 is again provided with base electrode 11 in the manner previously described. Two electrodes 20 and 21 are provided which are point electrodes in rectifying contact with the surface of body 10. Electrodes 20, 21 are the emitter and collector electrodes and may consist of wires of tungsten or Phosphor bronze having a diameter of 5 to 10 mils. Preferably each wire is coated with a film 22 consisting of an insulating material as previously explained. Each wire 20 and 21 is then provided with a chisel point indicated at 23 so that the two wires are spaced from each other by twice the thickness of film 22, the two chisel points 23, 23 being disposed in opposed relation. The thus resulting two point electrodes may be spaced apart approximately one mil depending on the thickness of film 22. The two wires 20 and 21 are secured to a ceramic or plastic support 25 which is provided above body 10 as clearly shown in Figure 2. One extremity of each wire 20 and 21 may be secured to support 25 by suitable means such as rivets 26. The two wires extend parallel to each other from their chisel points 23 through an opening 27 in support 25. Opening 27 is sufficiently large to allow free movement of the wires 20, 21 therethrough. The intermediate portions of the wires are curved as indicated at 30 and 31 to provide a spring action when support 25 is pressed against body 10 to provide the desired contact pressure between chisel points 23 and body 10. The curved portions 30, 31 may consist of two loops 32 and 33 extending approximately at right angles to each other as clearly shown in Figures 2 and 3.

It is to be understood that it is only necessary to provide one of the wires 20 or 21 with an insulating film 22. Alternatively, one or both of the wires 20 and 21 may be provided with an insulating sleeve 22. The construction of Figures 2 and 3 will considerably facilitate the positioning of the wires and their spacing which is determined by the thickness of film 22.

There has thus been disclosed an improved semi-conductor device having emitter and collector electrodes which are spaced by an insulating member or film which may be sprayed on one or both of the electrodes. This insulating film will prevent short circuiting between the emitter and collector electrodes and will consequently permit a considerably closer spacing of the electrodes thereby to improve the gain, the power output and the high frequency performance of the device.

What is claimed is:

1. A semi-conductor device comprising a semi-conducting body, an insulating supporting member spaced from said body and having an opening, a pair of electrodes, each consisting of a filamentary conductor having one extremity secured to said member, the other extremity of each of said conductors having a sharp point in contact with said body, a further electrode in low-resistance contact with said body, and an insulating film covering one of said conductors with the exception of its point, said conductors extending parallel to each other and spaced by said film from said points through the opening in said member and having each a curved intermediate portion to provide a spring action when said member is pressed toward said body, said supporting member being disposed between said point and said curved portion of each of said conductors.

2. A semi-conductor device comprising a semi-conducting body, an insulating supporting member spaced from said body and having an aperture, a pair of electrodes, each consisting of a filamentary metallic conductor having one extremity secured to a portion of said member, said portions being disposed opposite said aperture, the other extremity of each of said conductors having a chisel point in contact with said body, a further electrode in low-resistance contact with said body, and an insulating layer covering each of said conductors with the exception of said chisel points, said conductors extending parallel to each other and spaced by said layers from säid chisel points through the aperture in said member and having each a curved intermediate portion to provide a spring action when said member is pressed toward said body to provide a desired contact pressure between said body and said chisel points, said supporting member being disposed between said point and said curved portion of each of said conductors and in close proximity to the surface of said body contacted by said conductors.

3. A semi-conductor device comprising a semi-conducting body, an insulating support member spaced from said body and having an opening, a pair of electrodes, each consisting of a wire having one extremity secured to opposite portions of said support with respect to said opening, the other extremity of each of said wires having a chisel point in contact with said body, said chisel points being disposed in opposed relation, a further electrode in low-resistance contact with said body, and an insulating film covering each of said wires with the exception of said chisel points, said wires extending parallel to each other and spaced by said films from said chisel points through the opening in said member and having each an intermediate portion with two loops extending approximately at right angles to each other to provide a spring action when said member is pressed toward said body to provide a predetermined contact pressure between said body and said wires, said support member being positioned between said point and said loops of each of said conductors and in close proximity to both said points of said conductors and to the surface of said body contacted by said points whereby close spacing between said conductors is achieved and maintained and whereby said predetermined contact pressure is maintained.

4. A semi-conductor device comprising a semi-conducting body, an insulating support member spaced from said body and having an opening, a pair of small area electrodes insulated from each other and extending through said opening, said electrodes being in rectifying contact with said body and each having a curved intermediate portion, said insulating support member being positioned between said body and said curved portion of said electrodes, and a further electrode in low resistance contact with said body.

5. A semi-conductor device comprising a semi-conducting body, a insulating disk support member spaced from said body and having an opening, a pair of small area filamentary electrodes extending through said opening and in rectifying contact with said body, each of said electrodes having a curved intermediate portion to provide a spring action, an insulating film separating said electrodes, said insulating support member being positioned between said body and said curved portion of said electrodes, and a further electrode in low resistance contact with said body.

References Cited in the file of this patent

UNITED STATES PATENTS

| Number | Name | Date |
|---|---|---|
| 1,900,018 | Lilienfeld | Mar. 7, 1933 |
| 2,486,776 | Barney | Nov. 1, 1949 |
| 2,615,965 | Amico | Oct. 28, 1952 |